United States Patent
Lin

(10) Patent No.: US 10,018,427 B2
(45) Date of Patent: Jul. 10, 2018

(54) VAPOR CHAMBER STRUCTURE

(71) Applicant: TAIWAN MICROLOOPS CORP., New Taipei (TW)

(72) Inventor: Chun-Hung Lin, New Taipei (TW)

(73) Assignee: TAIWAN MICROLOOPS CORP., New Taipei (TW)

( * ) Notice: Subject to any disclaimer, the term of this patent is extended or adjusted under 35 U.S.C. 154(b) by 40 days.

(21) Appl. No.: 15/260,184

(22) Filed: Sep. 8, 2016

(65) Prior Publication Data

US 2018/0066898 A1    Mar. 8, 2018

(51) Int. Cl.
| F28F 7/00 | (2006.01) |
| F28D 15/04 | (2006.01) |
| H05K 7/20 | (2006.01) |

(52) U.S. Cl.
CPC ......... *F28D 15/04* (2013.01); *H05K 7/20336* (2013.01)

(58) Field of Classification Search
CPC ...... F28D 15/04; F28D 15/043; F28D 15/046; F28D 2015/0216; F28D 2021/0028; F28D 2021/0029; H05K 7/20336; H05K 7/2029; H05K 7/208; H05K 7/20809; H05K 7/20818; H05K 7/20881; H05K 7/20936; H05K 7/2099; F21V 29/006; F21V 29/40; F21V 29/402; F21V 29/51; H01F 27/18; H01L 23/427; H01L 33/648; H01L 23/40; H01L 23/46; H01L 23/473; H01L 23/4735
USPC .............................. 165/80.4, 104.26; 361/700
See application file for complete search history.

(56) References Cited

U.S. PATENT DOCUMENTS

| 6,397,935 | B1* | 6/2002 | Yamamoto | F28D 15/0233 |
| | | | | 165/104.21 |
| 8,667,684 | B2* | 3/2014 | Dai | F28D 15/046 |
| | | | | 165/104.26 |
| 2003/0062149 | A1* | 4/2003 | Goodson | F04B 19/006 |
| | | | | 165/104.11 |
| 2006/0124281 | A1* | 6/2006 | Rosenfeld | F28D 15/046 |
| | | | | 165/104.26 |
| 2007/0227703 | A1* | 10/2007 | Bhatti | F28D 15/02 |
| | | | | 165/104.26 |
| 2007/0240857 | A1* | 10/2007 | Hou | F28D 15/046 |
| | | | | 165/104.26 |
| 2009/0205812 | A1* | 8/2009 | Meyer, IV | F28D 15/0233 |
| | | | | 165/104.26 |
| 2010/0139894 | A1* | 6/2010 | Zhou | F28D 15/046 |
| | | | | 165/104.26 |
| 2010/0265727 | A1* | 10/2010 | Liu | F21K 9/00 |
| | | | | 362/373 |
| 2012/0111553 | A1* | 5/2012 | Tsoi | F28D 15/0233 |
| | | | | 165/185 |

(Continued)

*Primary Examiner* — Justin Jonaitis
(74) *Attorney, Agent, or Firm* — Chun-Ming Shih; HDLS IPR SERVICES

(57) ABSTRACT

A vapor chamber structure includes an upper metal casing, a lower metal casing, a partition plate and a working fluid. The lower metal casing is engaged and sealed with the upper metal casing, and a containing chamber is formed between the upper metal casing and the lower metal casing. The partition plate is laid inside the containing chamber and includes a gas channel configured to be facing the upper metal casing. The working fluid is filled in the containing chamber. Therefore, the gas evaporated in the vapor chamber will move along a fixed path to prevent the occurrence of turbulence effectively.

10 Claims, 6 Drawing Sheets

(56) References Cited

U.S. PATENT DOCUMENTS

2015/0289413 A1\* 10/2015 Rush .................. H05K 7/20672
361/700

\* cited by examiner

VAPOR CHAMBER STRUCTURE

FIELD OF THE INVENTION

The technical field generally relates to a thermal conduction technology, more particularly to a vapor chamber structure.

BACKGROUND OF THE INVENTION

As the computing speed of electronic devices increases, the amount of heat generated by the electronic devices becomes increasingly greater. To overcome the large quantity of generated heat, manufacturers have introduced and extensively used a vapor chamber for dissipating the heat. However, the thermal conduction performance, the manufacturing cost, and the level of difficulty of the manufacture of the conventional vapor chamber still have room for improvements.

In general, the conventional vapor chamber comprises an upper casing, a lower casing, and a capillary tissue installed in the interior space between the upper casing and the lower casing, and then the upper casing and the lower casing are welded and engaged with one another, and a working fluid is filled in the upper casing and the lower casing, and finally processes including an air removal process and a sealing process are performed to complete the manufacture of the conventional vapor chamber.

Although such conventional vapor chamber has the thermal conduction performance, its practical application still has the following problems.

The lower casing is attached directly to the heat source, and the interior space of the vapor chamber does not have any shielding mechanism, so that after the liquid-state working fluid in the vapor chamber is heated and vaporized into a gas-state working fluid, the gas molecules become very active and interfere with one another, and undesirable phenomenon such as turbulence may occur in the interior space of the vapor chamber. In addition, the quantity of the working fluid in the interior space of the vapor chamber has a significant effect on the thermal conduction of the working fluid, since too much working fluid will reduce the space of gas inside the vapor chamber, and the amount of heat to be dissipated is very small. Although too little working fluid can increase the space of gas inside the vapor chamber to dissipate the heat quickly, yet the liquid-state working fluid may flow back and cause bad situation such as dry-out, etc. Obviously, the conventional vapor chamber requires improvements.

SUMMARY OF THE INVENTION

It is a primary objective of this disclosure to provide a vapor chamber structure capable of maintaining the gas evaporated in the vapor chamber to move along a fixed path, so as to prevent the occurrence of turbulence effectively.

To achieve the aforementioned and other objectives, this disclosure provides a vapor chamber structure, comprising an upper metal casing, a lower metal casing, a partition plate and a working fluid, wherein the lower metal casing is engaged and sealed with the upper metal casing; a containing chamber is formed between the upper metal casing and the lower metal casing; the partition plate is installed in the containing chamber and has at least one gas channel formed thereon and configured to be facing the upper metal casing; and the working fluid is filled in the containing chamber This disclosure further has the following effect. A spaced groove is formed between the plate body and the riser, and provided for accelerating the backflow of the liquid-state working fluid to overcome the dry-out issue of the vapor chamber effectively.

DESCRIPTION OF THE PREFERRED EMBODIMENTS

The technical contents of this disclosure will become apparent with the detailed description of preferred embodiments accompanied with the illustration of related drawings as follows. It is intended that the embodiments and figures disclosed herein are to be considered illustrative rather than restrictive.

Figure 1:
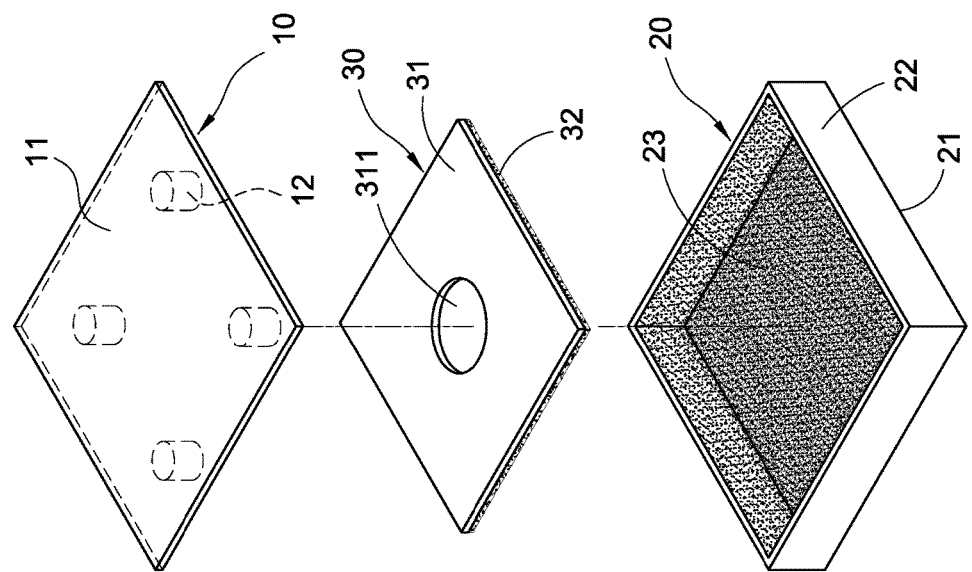
FIG. 1 is an exploded view of a first preferred embodiment of this disclosure.
Figure 2:
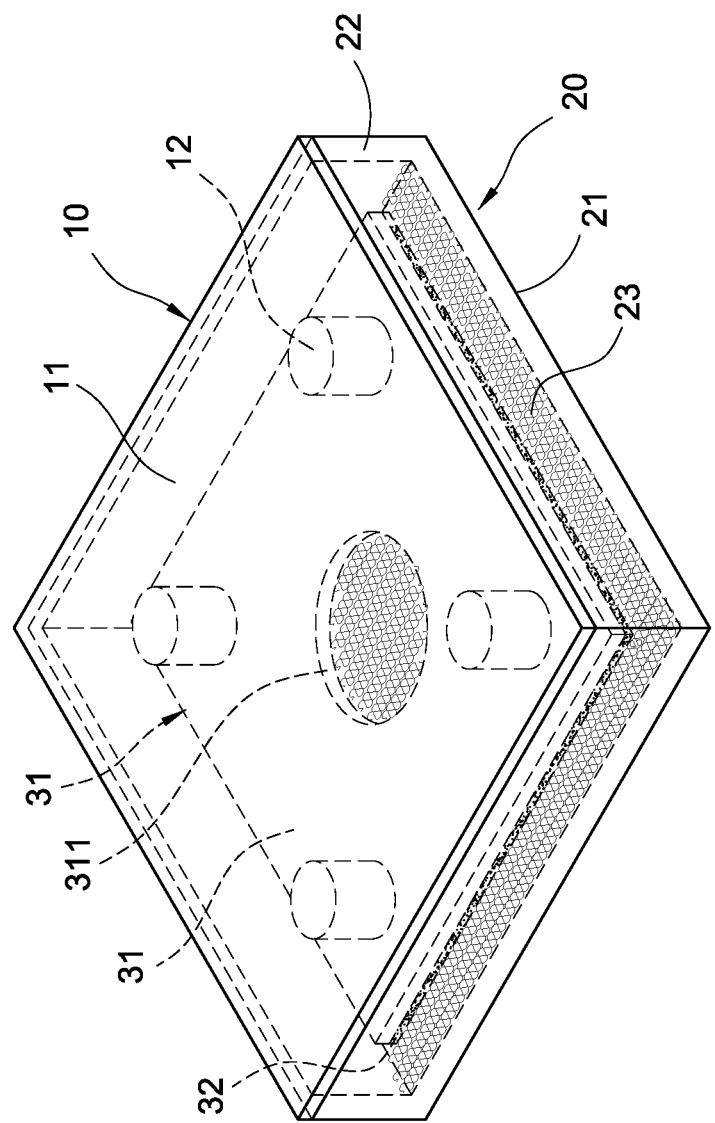
FIG. 2 is a schematic perspective view of the first preferred embodiment of this disclosure.
Figure 3:
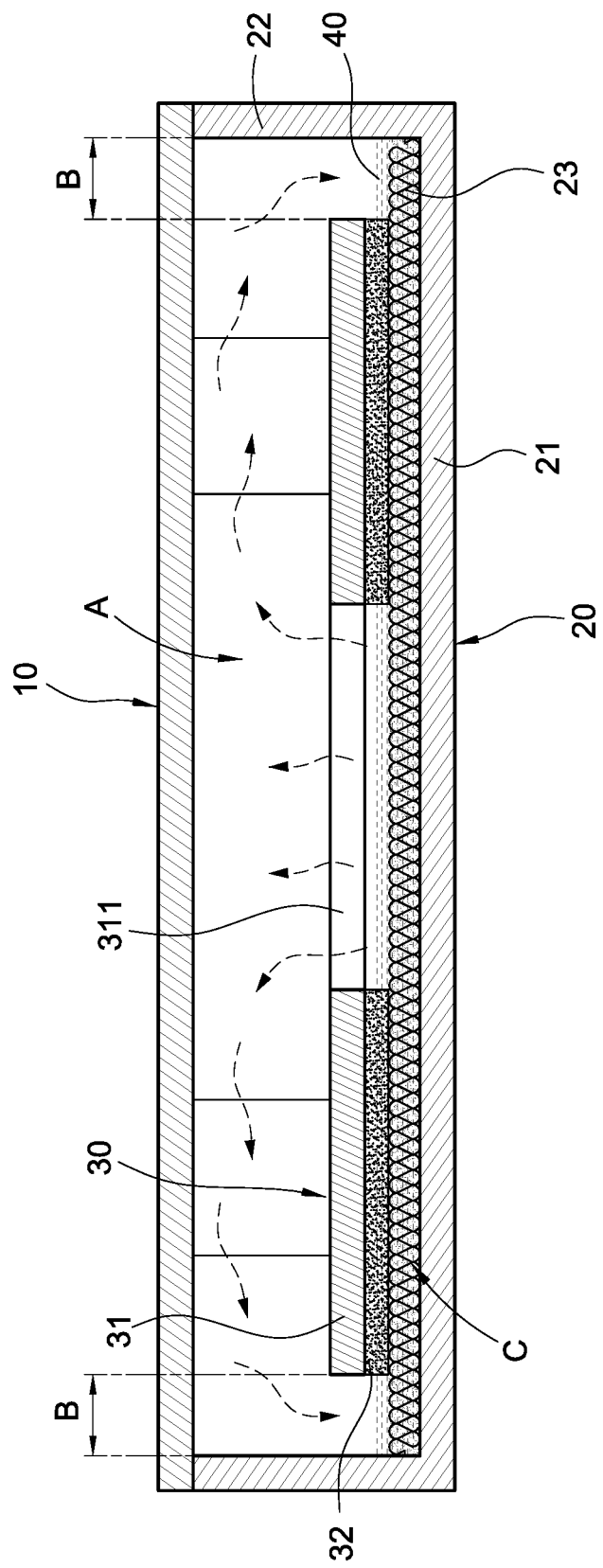
FIG. 3 is a sectional view of an application of the first preferred embodiment of this disclosure.

With reference to FIGS. 1 and 3 for a vapor chamber structure of this disclosure, the vapor chamber structure comprises an upper metal casing 10, a lower metal casing 20, a partition plate 30, and a working fluid 40.

The upper metal casing 10 is made of a highly conductive material such as copper, aluminum or their alloys. In this preferred embodiment, the upper metal casing 10 includes but not limited to a rectangular top plate 11. The bottom surface of the top plate 11 has a capillary tissue (not shown in the figure) disposed thereon and made of a material such as metal mesh, fiber bundle or metal powder sinter. The inner surface of the top plate 11 is coupled to a plurality of support pillars 12.

The lower metal casing 20 is also made of a highly conductive material such as copper, aluminum or their alloys. In this preferred embodiment, the lower metal casing 20 has a rectangular base plate 21 and a riser 22 bent and extended upwardly from the base plate 21, and the lower metal casing 20 is engaged and sealed with the upper metal casing 10, such that a containing chamber A is formed between the upper metal casing 10 and the lower metal casing 20. The inner surfaces of the base plate 21 and the riser 22 have a capillary structure 23 installed thereon and made of a material such as a metal mesh, a fiber bundle, or a metal powder sinter. In this preferred embodiment, the capillary structure 23 disposed on the inner surface of the riser 22 is a metal powder sinter, and the capillary structure 23 disposed on the inner surface of the base plate 21 is a metal mesh.

The partition plate 30 is also made of a highly conductive material such as copper, aluminum or their alloys. In this preferred embodiment, the partition plate 30 includes but not limited to a rectangular plate body 31. A gas channel 311 is formed at the middle position of the plate body 31 and configured to be facing the upper metal casing 10. In this preferred embodiment, the gas channel 311 includes but not limited to a circular hole. In addition, the bottom surface of the plate body 31 has a capillary tissue 32 disposed thereon and made of a material such as a metal powder sinter.

The partition plate 30 is laid inside the containing chamber A. In other words, the plate body 31 of the partition plate 30 is configured to be parallel to the base plate 21 of the lower metal casing 20, and the capillary tissue 32 of the partition plate 30 is attached to the capillary structure 23 of the lower metal casing 20, and a liquid channel C is formed between the plate body 31 and the base plate 21, and the liquid channel C contains the capillary structure 23 and the capillary tissue 32. In addition, the capillary tissue 32 of the partition plate 30 and the capillary structure 23 of the lower metal casing 20 may be arranged not to be attached or contacted with each other (not shown in the figure). In addition, a spaced groove B is formed between the periphery of the plate body 31 and the inner surface of the riser 22 and communicated with the liquid channel C. Each support pillar 12 abuts the top surface of the plate body 31.

The working fluid 40 is water and communicated with the containing chamber A through a liquid-inputting and gas-removing pipe (not shown in the figure), and the working fluid 40 is filled in the containing chamber A formed by the upper metal casing 10 and the lower metal casing 20, and the liquid-inputting and gas-removing pipe is provided for gas removal and manufacture as well as the operation of sealing the liquid-inputting and gas-removing pipe, so as to complete the manufacture of the vapor chamber structure of this disclosure.

During use, the base plate 21 of the lower metal casing 20 is attached to a heat source (not shown in the figure). After the base plate 21 receives the heat generated by the heat source, the working fluid 40 in the vapor chamber is evaporated into a gas-state working fluid. Since the gas-state working fluid can just flow through a fixed path of the gas channel 311 and can flow upwardly to the upper half of the containing chamber A, therefore the gas-state working fluid in the containing chamber A will not interfere with each other, so as to prevent the occurrence of turbulence. Further, a part of the gas-state working fluid is condensed into a liquid-state working fluid when touching the inner wall of the low-temperature upper metal casing 10, and capillary force of the capillary structure 23 drives the gas-state working fluid to flow back to the base plate 21. Another part of the gas-state working fluid passes through the spaced groove B directly and drives the liquid-state working fluid to flow along the liquid channel C and return to the base plate 21 quickly, so as to overcome the dry-out issue of the vapor chamber.

Figure 4:
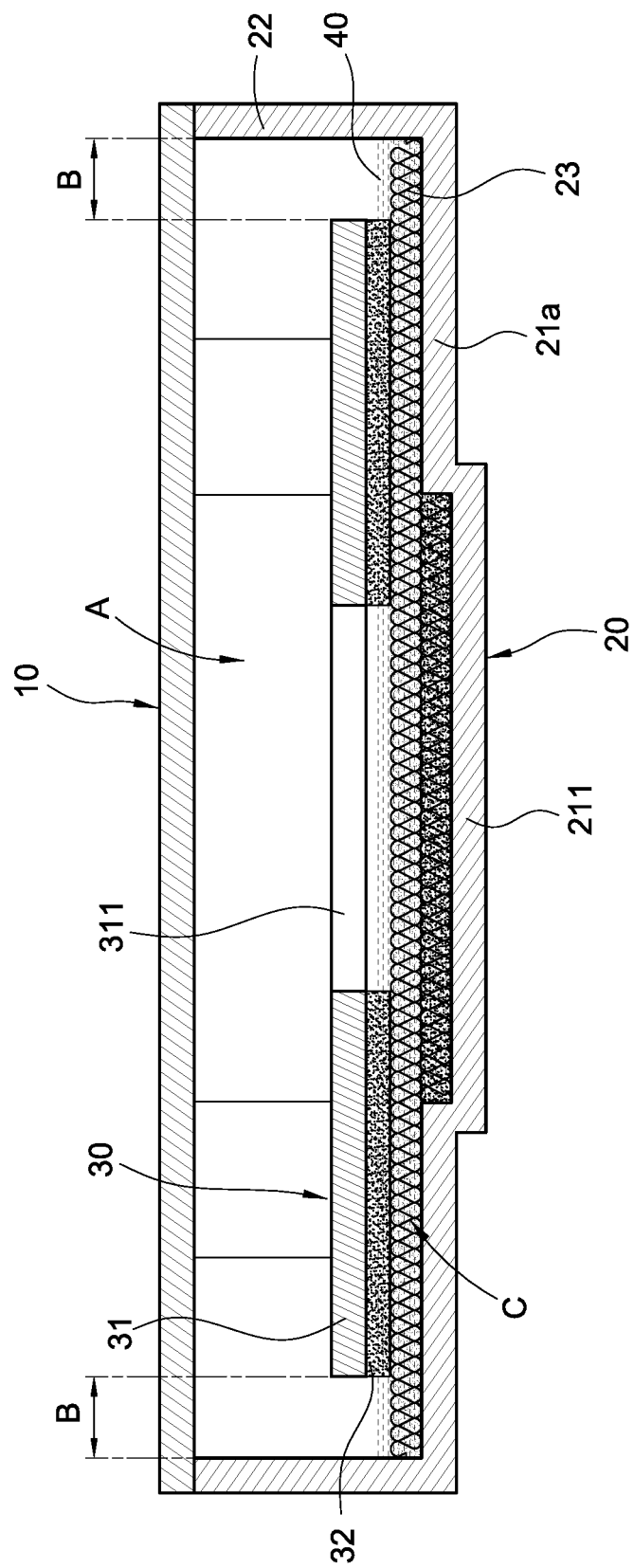
FIG. 4 is a sectional view of a second preferred embodiment of this disclosure.

With reference to FIG. 4 for another embodiment of this disclosure, the difference between this preferred embodiment and the previous preferred embodiment resides on that this preferred embodiment has a projecting platform 211 formed at the middle of the base plate 21 and extended downwardly from the base plate 21 and aligned precisely with the gas channel 311. The projecting platform 211 is attached to the top surface of an electronic heat source (not shown in the figure) directly.

Figure 5:
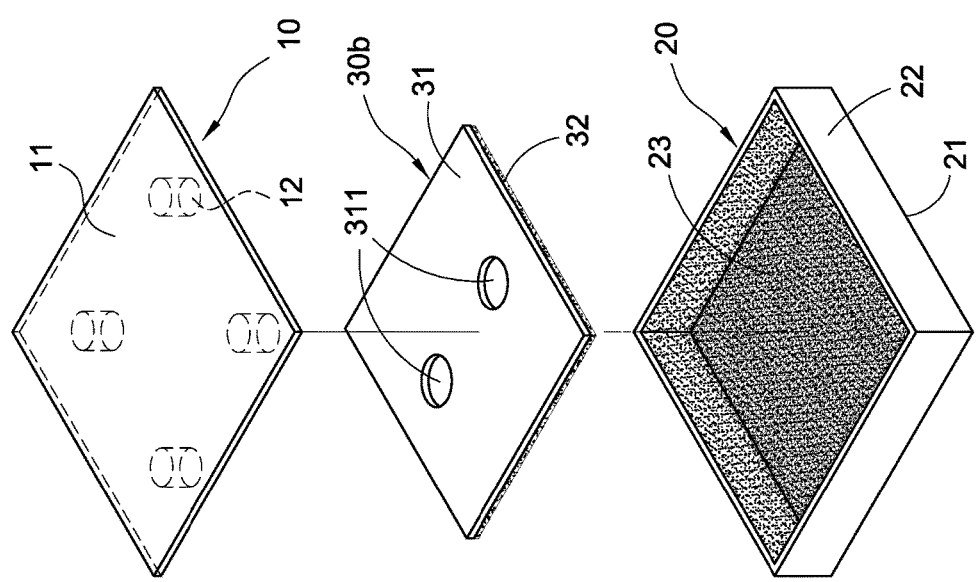
FIG. 5 is an exploded view of a third preferred embodiment of this disclosure.
Figure 6:
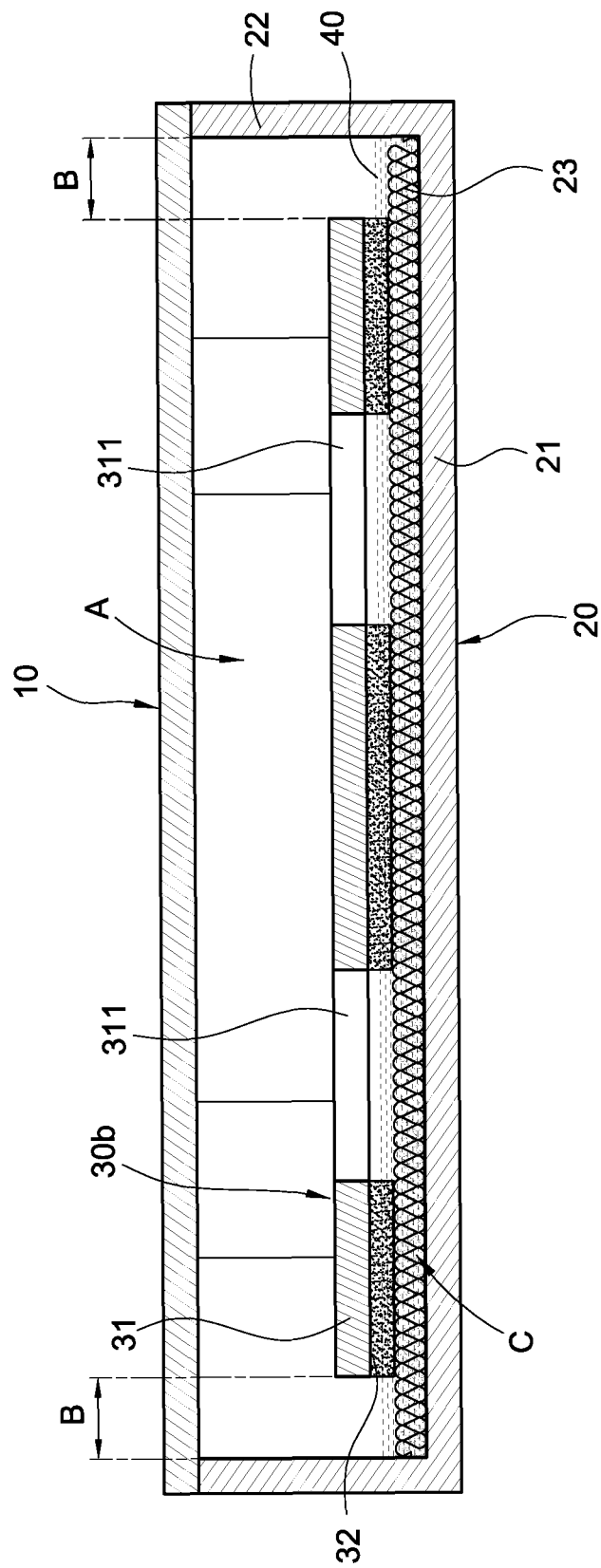
FIG. 6 is a sectional view of the third preferred embodiment of this disclosure.

With reference to FIGS. 5 and 6 for another preferred embodiment, the difference between this preferred embodiment and the previous preferred embodiments resides on that the partition plate 30b of this preferred embodiment has two gas channels 311 formed thereon, and the two gas channels 311 are separated from each other to reduce the interference between the gas-state working fluids passing through the gas channels 311.

While this disclosure has been described by means of specific embodiments, numerous modifications and variations could be made thereto by those skilled in the art without departing from the scope and spirit of this disclosure set forth in the claims.

What is claimed is:

1. A vapor chamber structure, comprising:
an upper metal casing;
a lower metal casing, engaged and sealed with the upper metal casing, and a containing chamber being formed between the upper metal casing and the lower metal casing;
a partition plate, laid inside the containing chamber, and having at least one gas channel formed thereon and configured to be facing the upper metal casing; and
a working fluid within the containing chamber,
wherein a capillary structure disposes on an inner side of the lower metal casing, and a capillary tissue horizontally and directly contacts the partition plate and is sandwiched between the partition plate and the capillary structure.

2. The vapor chamber structure according to claim 1, wherein the lower metal casing has a base plate, the partition plate has a plate body, the plate body is configured to be parallel to the base plate, and a liquid channel is formed between the plate body and the base plate.

3. The vapor chamber structure according to claim 2, wherein the capillary structure and the capillary tissue are attached with each other and formed in the liquid channel.

4. The vapor chamber structure according to claim 2, wherein the base plate has a capillary structure disposed thereon, and the bottom surface of the plate body has a capillary tissue installed thereon, and the capillary structure and the capillary tissue are formed in the liquid channel.

5. The vapor chamber structure according to claim 2, wherein the lower metal casing further includes a riser bent and extended from the base plate, and a spaced groove is formed between the periphery of the plate body and the inner surface of the riser and communicated with the liquid channel.

6. The vapor chamber structure according to claim 5, wherein the inner surface of the riser has a capillary structure disposed thereon.

7. The vapor chamber structure according to claim 1, wherein the lower metal casing has a base plate, and a projecting platform extended downwardly from the base plate and aligned precisely with the gas channel.

8. The vapor chamber structure according to claim 1, wherein the partition plate has a plurality of gas channels.

9. The vapor chamber structure according to claim 1, wherein the upper metal casing has a top plate, and an inner surface of the top plate is coupled to a plurality of support pillars.

10. The vapor chamber structure according to claim 9, wherein the partition plate has a plate body, and each support abuts the plate body.

* * * * *